United States Patent
Basker et al.

(10) Patent No.: US 9,105,662 B1
(45) Date of Patent: Aug. 11, 2015

(54) METHOD AND STRUCTURE TO ENHANCE GATE INDUCED STRAIN EFFECT IN MULTIGATE DEVICE

(71) Applicant: International Business Machines Corporation, Armonk, NY (US)

(72) Inventors: Veeraraghavan S. Basker, Schenectady, NY (US); Pranita Kerber, Mount Kisco, NY (US); Junli Wang, Slingerlands, NY (US); Tanko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 14/161,745

(22) Filed: Jan. 23, 2014

(51) Int. Cl.
*H01L 21/336* (2006.01)
*H01L 29/66* (2006.01)
*H01L 29/165* (2006.01)
*H01L 29/78* (2006.01)

(52) U.S. Cl.
CPC ........ *H01L 29/66795* (2013.01); *H01L 29/165* (2013.01); *H01L 29/785* (2013.01); *H01L 29/7848* (2013.01)

(58) Field of Classification Search
None
See application file for complete search history.

(56) References Cited

U.S. PATENT DOCUMENTS

| 7,256,142 | B2 | 8/2007 | Fitzgerald |
| 7,282,402 | B2 | 10/2007 | Sadaka et al. |
| 8,058,157 | B2 | 11/2011 | Zhu et al. |
| 8,334,570 | B2 | 12/2012 | Xu et al. |
| 8,368,146 | B2 | 2/2013 | Basker et al. |
| 8,368,149 | B2 * | 2/2013 | Lander .......................... 257/369 |

OTHER PUBLICATIONS

"Structure, Morphology and Nanoindentation Behavior of Multilayered TiN/TaN Coatings", J. An, et al., Surface and Coatings Technology (2005); pp. 2451-2458.

\* cited by examiner

*Primary Examiner* — Kyoung Lee
(74) *Attorney, Agent, or Firm* — H. Daniel Schnurmann

(57) ABSTRACT

A FinFet formed by depositing a thin layer of polycrystalline silicon followed by depositing a stress containing material, including a high Ge percentage silicon germanium film and/or a high stress W film on top of a polycrystalline silicon film. Freeing space between fins allows stressor films to be deposited closer to the transistor channel, improving the proximity of the stress containing material to the transistor channel and enhancing the stress coupling efficiency by defining a ratio between stress level in the stressor film and stress transferred to the channel for a mobility enhancement. The stress level is enhanced by patterning by removing the n-type workfunction metal from the p-FinFET. After stripping off the soft or hard mask, the p-type workfunction metal is deposited in the n- and p-FinFET regions. The freed space specifically for p-FinFet between the fins achieves an even higher stressor coupling to further boost the carrier mobility.

17 Claims, 8 Drawing Sheets

METHOD AND STRUCTURE TO ENHANCE GATE INDUCED STRAIN EFFECT IN MULTIGATE DEVICE

FIELD OF THE INVENTION

The present invention relates to the fabrication of semiconductor devices, and more particularly, to the formation of a gate stack of an n-type FET and a p-type FET to enhance the strain level in the channel to generate carrier mobility and drive current performance benefits in multigates or trigates.

BACKGROUND AND RELATED ART

Current techniques of forming gate stack in the FinFET device structure starts with depositing high-k metal dielectric material such as $HfO_2$, $Al_2O_3$, or $La_2O_3$ by ALD process. The process can be done either following the fin formation, referenced as the "gate first" scheme (also referenced as the metal inserted polysilicon), or it can be done after the formation of the source and drain in a process referred to as "gate last", (also referenced as "replacement metal gate" (RMG) scheme). The gate first and gate last refer to whether a metal electrode is deposited before or after the high temperature activation anneals of the flow. It is then followed by a workfunction metal deposition to set the transistor threshold voltage. Typical materials that are employed include TiN, TiC, or TiAl.

Since the requirement for a threshold voltage between an n-type MOSFET transistor and p-type MOSFET differs, the gate stack formation can involve a certain patterning process, e.g., to deposit either one type of workfunction metal first on both n-type and p-type FETs, followed by removing it from one side, and then depositing the desired workfunction metal to set the right threshold voltage for both types of transistors. The next step consists in depositing the gate contact material to lower the gate resistance. In the gate first scheme, the process is followed by an offset space deposition, and an epitaxial process to form the source and drain of the transistors. While in the gate last (RMG) scheme, the process is followed by the middle-of-the-line (MOL) source/drain contact formation such as by a contact etch, TiN barrier layer and W film deposition.

As the device continues to the nanometer scaling, the requirement for the transistor drive current performance becomes increasingly more difficult to meet. One difficulty that encountered resides in the conventional stress effect, such as an embedded silicon germanium, embedded silicon carbon source drain, and dual stress silicon nitride liner set to boost the carrier mobility that diminishes significantly with the scaling of the gate contact pitch.

The process typically starts with the recess of a silicon source and the drain region, followed by a SiGe or SiC film epitaxial growth in the trench region. Typically, it consists of three different layers, the first layer referenced as the buffer layer which is usually lightly doped to provide the junction gradient control and device short channel electrostatic benefit. Then, the process continues with the main layer heavily doped to lower the source and drain sheet resistance. A typical dopant is boron for a p-type MOSFET, and phosphorus or arsenic for the n-type transistor. The incorporation of the germanium for a p-type MOSFET and carbon for the n-type MOSFET is by introducing the strain from the source and drain region to the channel region. The fact that germanium atom has a larger lattice constant than silicon atom produces a tensile strain in the SiGe film itself when it creates bonding with the silicon atom. The stress is then transferred to the channel region to generate a compressive strain that is favorable for the transport of holes and thus enhances the p-type MOSFET drive current. The effect of the carbon atom is just the opposite. The fact that carbon atom has a smaller lattice constant than silicon atom produces a compressive strain in the SiC film itself when it creates bonding with the silicon atom. The stress is then transferred to the channel region to generate the tensile strain that is favorable for the transport of electrons and thus enhances the n-type MOSFET drive current. The stress effect from the embedded source drain either is made of SiGe or SiC that drops significantly when the device gate pitch continues to scale. The pitch scaling is necessary because of the chip area reduction set to improve the cost structure of the semiconductor. However, because of the pitch scaling, the available space for the source and drain stressor formation becoming smaller and smaller, this leading to the decrease of the stressor volume and a greatly reduction of the stress effect from the source and the drain region. The stress effect has been estimated to be about only 20-30% left when the technology feature size shrinks from the 22 nm node technology to the 14 nm node technology.

Another factor that limits the usage of source and drain extrinsic stressor is the transition from the planar device structure to the FinFFT type of the transistor structure. The fact that FinFET device is provided of a thin slab of silicon as the channel (typical dimensions are 10 nm width and 30 nm tall) which signifies that the area for stress coupling is much reduced compared to the planar device structure which makes the stress coupling efficiency, defined as the ratio between stress level in the source and drain region to the stress level in the device channel region that becomes significantly less compared to the planar device. The reduction of the aforementioned two effects (stressor volume and stress coupling) makes the stress engineering of the FinFET device structure ever more challenging compared to that of previous generations.

The challenge for the gate induced strain, however, is how to implement it through the selection of gate stack materials to meet not only the channel strain requirement for carrier mobility boost, but also a workfunction setting to meet the transistor threshold voltage requirement. It further has to have minimized gate stack inversion thickness impact so that the transistor drive current benefit from gate induced strain will not be compromised. Gate stack materials such as TiN, TaN, and TiC have a certain level of strain itself, preferably in the range of 2 GPa to 3 GPa which is quite significant in terms of producing channel strain when the coupling ratio is sufficiently high. The contact material such as W is also known for having a tensile strain favorable for the transistor mobility enhancement.

The challenge is, as previously mentioned, how to design the gate stack thickness and structure such that the stress benefit can be maximized, but at the same time, without affecting other device parametrics, such as the transistor threshold voltage and the inversion gate stack thickness.

SUMMARY

In one aspect, embodiments of the invention provide a method and a FinFET device structure that form a gate stack stress of a finFET to increase the mobility and drive current.

In an embodiment, a method is described of forming a FinFET that includes depositing high-k dielectric on a patterned fin structure with recess shallow trench isolation. A workfunction metal and a very thin layer of poly crystalline silicon are then deposited on top of the high-k materials. A stress containing material such as high Ge percentage silicon germanium film and/or highly stress W film is then deposited on top of the poly crystalline silicon film. In the case of a high Ge percentage silicon film, the film can be formed either in-situ or ex-situ doped with dopant to lower the gate resistance. The in-situ doped film can be achieved by incorporating dopants during the silicon germanium epitaxial growth, whereas the ex-situ doped film can be achieved by ion-implantation following a silicon germanium epitaxial growth. Preferably, the gate stack has thick poly-crystalline silicon on top of the workfunction metal that occupies the space between the fins, leaving no room for strain producing material to impart a stress in the transistor channel for mobility enhancement.

In an embodiment, a method and structure are described freeing up the space between the fins to allow the stressor films being deposited closer to the channel, thus improving the proximity of the stress containing material to the transistor channel, thereby enhancing the stress coupling efficiency defined as the ratio between the stress level in the stressor film and the stress transferred to the channel for mobility enhancement.

In an embodiment, a method is described forming a semiconductor device that includes depositing high-k dielectric on the patterned fin structure with recess shallow trench isolation. A workfunction metal for n-type MOSFET is deposited on top of high-k materials. Next, a patterning process can remove the n-type workfunction metal from the p-type MOSFET. After stripping off the soft or the hard mask, a p-type workfunction metal is deposited in both the n-type and p-type MOSFET regions. The stress containing material can be a high percentage Ge silicon germanium film and/or a highly stress W film is then deposited on top of the poly-crystalline silicon film.

In an embodiment, the structure is provided with fins on a substrate and includes workfunction metal and a highly stressed Tungsten (W), wherein the workfunction metal and the highly stressed W create a strain in the channel, with the workfunction metal wrapping around the fins. Notably, a highly stress W would fail to achieve the same results.

BRIEF DESCRIPTION OF THE DRAWINGS

The foregoing and other objects, features and advantages described herein will be apparent from the following more particular descriptions of example embodiments as illustrated in the accompanying drawings wherein like reference numbers generally represent like parts of exemplary embodiments.

DETAILED DESCRIPTION

Figure 1:
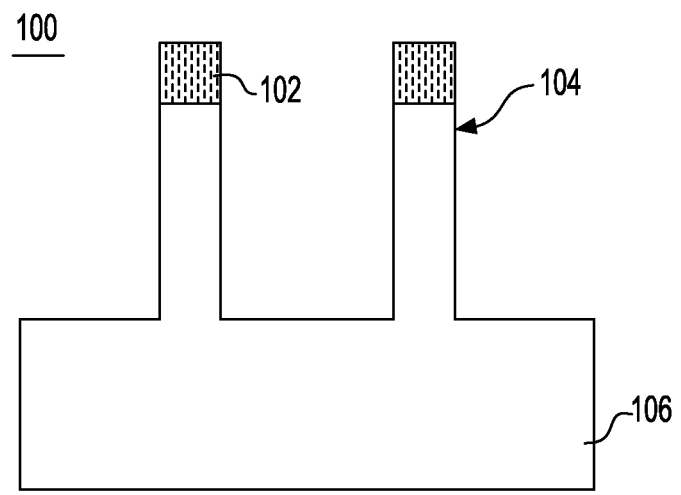
FIG. 1 is a cross-sectional view of a semiconductor device having a substrate and fin structures formed thereon.

It will be appreciated that for simplicity and clarity of illustration, elements shown in the drawings are not necessarily drawn to scale. For example, the dimensions of some of the elements may be exaggerated relative to other elements for clarity. As previously stated, the present disclosure relates to a semiconductor structure including locally thinned semiconductor fins, and a method for manufacturing the same. Aspects of the present disclosure will now be described in detail with accompanying figures. It is noted that like reference numerals refer to like elements across different embodiments. As used herein, ordinals such as "first" and "second" are employed merely to distinguish similar elements, and different ordinals may be employed to designate a same element in the specification and/or claims.

In a first exemplary semiconductor structure according to a first embodiment of the present disclosure can be formed by providing a semiconductor substrate, which can be a bulk semiconductor substrate or a semiconductor-on-insulator (SOI) substrate. At least an upper portion of the semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

Generally, an upper portion of the semiconductor substrate can be patterned by a combination of lithographic methods and an anisotropic etch used to form a plurality of semiconductor fins. The plurality of fins can include two outermost semiconductor fins and at least one nested semiconductor fin located between the two outermost semiconductor fins.

As used herein, the semiconductor fin refers to a semiconductor material portion having a pair of parallel vertical sidewalls laterally spaced by a uniform dimension. In one embodiment, each semiconductor fin can have a rectangular horizontal cross-sectional area such that the spacing between the pair of parallel vertical sidewalls is the same as the length of the shorter sides of the shape of the rectangular horizontal cross-sectional area. As used herein, a fin field effect transistor (finFet) refers to a field effect transistor in which at least a channel region is located within a semiconductor fin. As used herein, an "outermost semiconductor fin" refers to a semiconductor fin within a plurality of semiconductor fins located at an outermost location. Furthermore, a "nested semiconductor fin" refers to a semiconductor fin within a plurality of semiconductor fins located between the two outermost semiconductor fins of the plurality of semiconductor fins.

By way of example, a photoresist layer (not shown) can be applied over the top surface of the semiconductor substrate and lithographically patterned to mask portions of the semiconductor substrate, in which a plurality of semiconductor fins is subsequently formed. The pattern in the photoresist layer can be transferred to an upper portion of the semiconductor substrate to form the plurality of semiconductor fins. If the semiconductor substrate is a bulk substrate, the remaining portion of the semiconductor substrate underlying the plurality of semiconductor fins is referred to as a semiconductor material layer. In this case, the semiconductor material layer is a substrate on which the semiconductor fins are formed. The semiconductor material layer functions as a substrate mechanically supporting the plurality of semiconductor fins. The plurality of semiconductor fins and the semiconductor material layer collectively constitute a contiguous semiconductor material portion. In one embodiment, the entirety of the contiguous semiconductor material portion can be single crystalline. Alternatively, if the semiconductor substrate is a semiconductor-on-insulator (SOI) substrate, a vertical stack of a buried insulator layer and a handle substrate layer can be present underneath the plurality of semiconductor fins in lieu of the semiconductor material layer. In this case, the vertical stack of the buried insulator layer and the handle substrate layer is the substrate on which the semiconductor fins are formed.

The height of the semiconductor fins can range from 5 nm to 1,000 nm, although lesser and greater heights can also be employed. The plurality of semiconductor fins and the semiconductor material layer can be doped with electrical dopants, i.e., p-type dopants or n-type dopants, or be intrinsic.

Referring now to FIG. 1, a fin formation, preferably on a bulk substrate (106) is illustrated. The substrate material can be either silicon, silicon germanium, or III-V materials such as InGaAs, InAs or GaN. The fin is preferably formed by a sidewall image transfer (SIT) process to produce small dimensional features beyond the capability of the current lithography tools. The silicon substrate is first deposited with the amorphous silicon, then patterned to form mandrels. Next, the SIT spacer is formed by first depositing either a silicon oxide ($Si_2$) or silicon nitride $Si_3N_4$ layer, followed by etching the SIT spacer, leaving material only on the side of the mandrels. The mandrels are then pulled away by wet etch process, leaving the SIT spacer standing alone on top of the silicon substrate, serving as a hardmask (102). A silicon fin etch process is then performed to fabricate silicon fins with the dimension of 10 nm wide and 30 nm deep (104).

Figure 2:
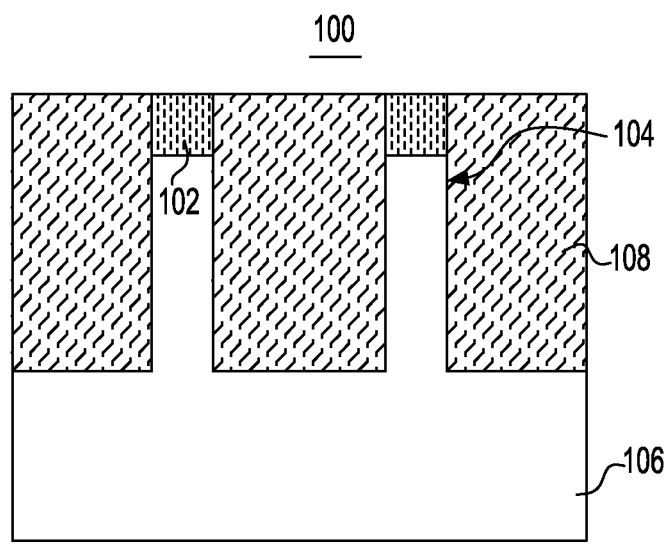
FIG. 2 shows a cross-sectional view of a semiconductor device having a substrate and fin structures formed thereon, with a shallow trench isolation oxide deposited between the fins.

FIG. 2 illustrates a shallow trench isolation material (STI) deposition (108) that can be formed among the plurality of semiconductor fins. The shallow trench isolation layer includes a dielectric material such as silicon oxide or silicon nitride or a combination thereof, referenced as a hybrid STI with good conformality and gap fill capability to fill the space between the fins. The shallow trench isolation layer can be formed by depositing a dielectric material over the semiconductor fins and the semiconductor material layer. The deposition of the dielectric material can be performed, for example, by chemical vapor deposition (CVD) or spin coating. Excess portions of the deposited dielectric material can be removed from above the top surfaces of the semiconductor in, e.g., by planarization preferably employing a chemical mechanical planarization (CMP). The shallow trench isolation layer laterally surrounds the plurality of semiconductor fins. The top surface of the shallow trench isolation layer can be coplanar with the top surfaces of the plurality of semiconductor fins. The material lying above the fin cap (102) is then polished, as previously described.

Figure 3:
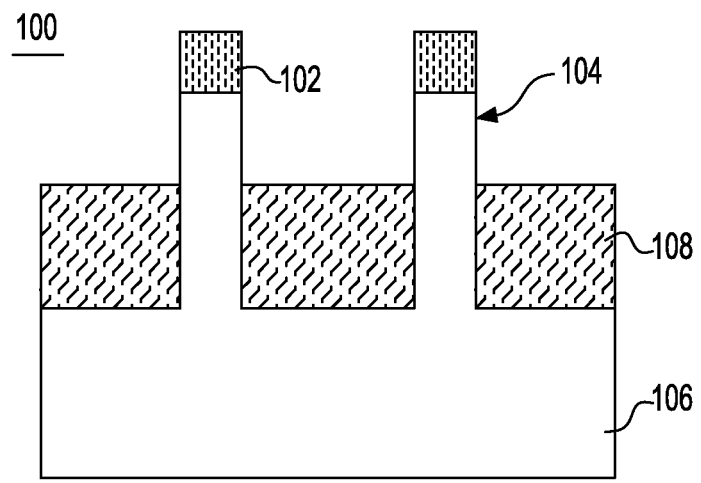
FIG. 3 is a cross-sectional view of a semiconductor device structure on a substrate where fin structures are formed with a shallow trench isolation oxide recessed between the fins.

Referring to FIG. 3, an STI etch back follows. The etching process can be achieved by a dry etch process with chemistry to etch away either the silicon oxide or the silicon nitride or a combination thereof (i.e., hybrid STI). The target etch depth is 30 nm, so that the same number fin (104) is exposed above the remaining STI (108).

Figure 4:
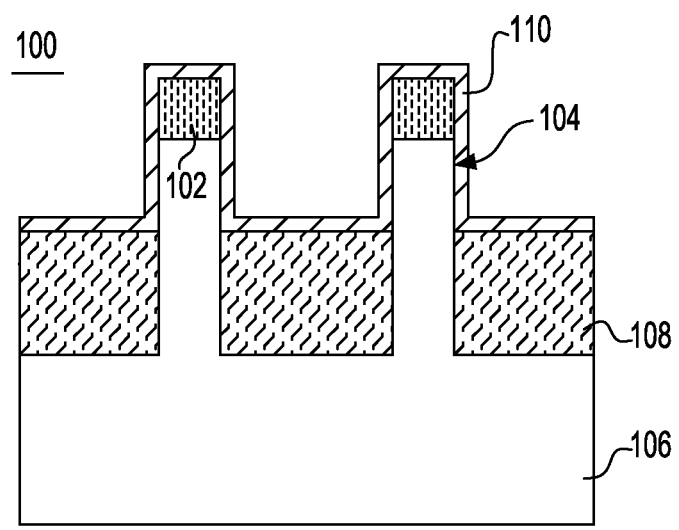
FIG. 4 illustrates a cross-sectional view of a semiconductor device having a substrate and fin structures formed and covered with a high-k dielectric.

FIG. 4 shows a high-k material deposition (110). The material serves as the gate dielectric to provide a high-k value to achieve a better device drive current benefit, but without increasing the physical thickness which is prone to cause additional leakage current. Typical high-k materials include HfO2, Al2O3, and La2O3. The process is followed by performing a post-deposition anneal at 700° C. in a furnace to densify the film following the deposition. Usually because of the oxygen effect, there is a 1 nm interfacial SiOx layer formed between the high-k material and the silicon substrate. The deposition is achieved by an atomic layer deposition (ALD) to achieve the thickness control and good conformality from the top of the fin to the bottom.

Figure 5:
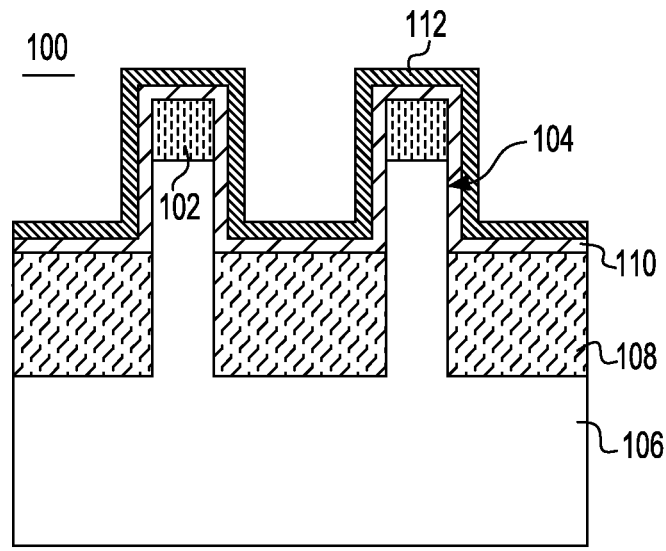
FIG. 5 is a cross-sectional view of a semiconductor device having a substrate and fin structures formed and covered with high-k dielectric and a workfunction metal.

FIG. 5 is an illustration of the deposition of the workfunction metal (112). A typical workfunction metal can consists of TiN, TaN, TiAlN, and TiC. The deposition is preferably achieved by the atomic layer deposition (ALD) to obtain thickness control and good conformality from the top of the fin to the bottom. The purpose of the workfunction metal is to provide the right threshold voltage of the transistor so that the device can produce enough drive current for switching the circuit.

Figure 6:
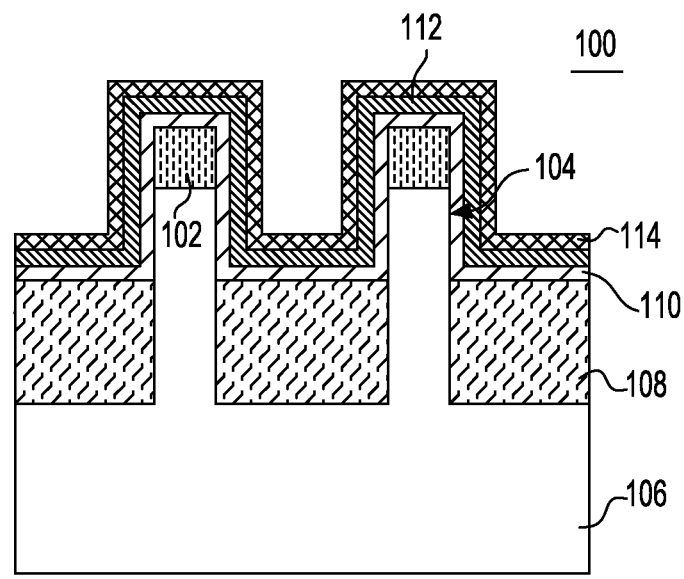
FIG. 6 shows a cross-sectional view of a semiconductor device having a substrate and fin structures formed and covered with high-k dielectric, a workfunction metal, to which is added a very thin layer of poly-crystalline silicon film, according to an embodiment of the invention.

FIG. 6 is an illustration of the deposition of a very thin layer of polycrystalline silicon (114) with dimensions preferably ranging between 5-10 nm. It is deposited first in the furnace as amorphous silicon, and then annealed at a 1025° C. spike temperature to form the crystalline structure. The purpose of the thin polycrystalline silicon layer is to provide a template of silicon atoms to facilitate the ensuing silicon germanium epitaxial process.

Figure 7:
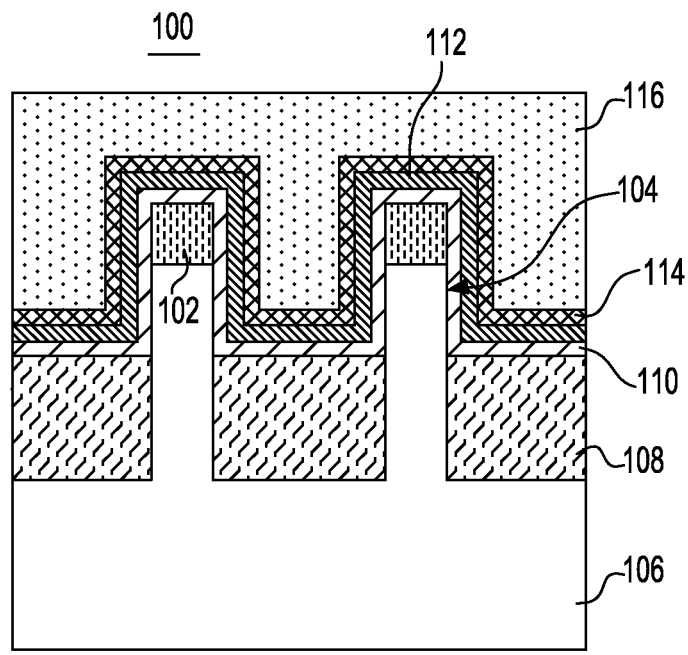
FIG. 7 is a cross-sectional view of a semiconductor device having a substrate and a plurality of fin structures formed and covered with a high-k dielectric, a workfunction metal, a very thin layer of poly-crystalline silicon film, and a high Ge percentage silicon germanium film or highly stress W film, according to one embodiment of the invention.

FIG. 7 is an illustration of an epitaxial growth of silicon germanium film (116) atop of the polycrystalline silicon. The epitaxial process can be preferably achieved in an epitaxial chamber, starting with a pre-clean by HF or pre-bake to ensure an oxide free surface, followed by silane and other ambient with carrier gas to grow the high Ge concentration silicon germanium films. The Ge percentage can advantageously rise to 52%. The purpose of using SiGe as the gate contact material is because the Ge has a larger lattice constant compared to silicon, indicative of the SiGe film having a tensile strain in the film itself. Simulation results shows that with 35% Ge silicon germanium film, the intrinsic stress level is 2 GPa. Stress can be induced to the channel to achieve 500 MPa along the fin length and a fin height direction and 400 MPa compressive stress along the fin width direction. When placed atop and on the sidewall of the fin channel, it produces strain in the channel region which is favorable for the n-type MOSFET electron carrier transport. The SiGe film also needs to be heavily doped with either boron or phosphorous up to 5e20/cm3 to ensure that the gate resistance is not an issue during the logic circuit or RF microwave transistor operation.

Figure 8:
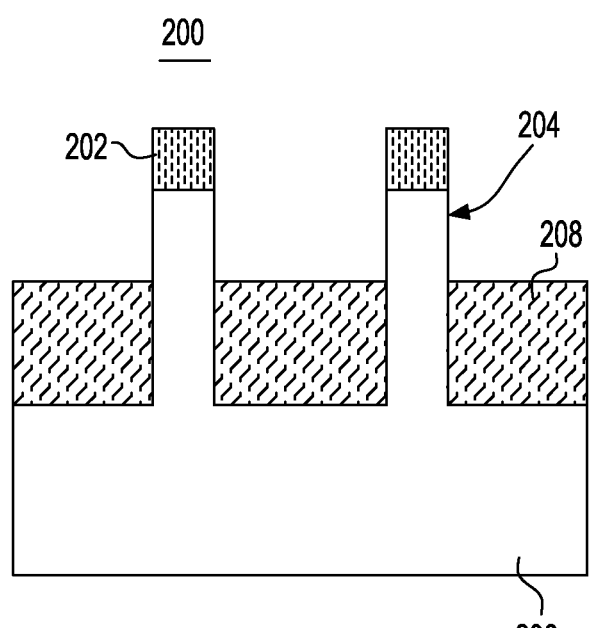
FIG. 8 illustrates a cross-sectional view of a semiconductor device structure having a substrate and fin structures formed with shallow trench isolation oxide recessed in between the fins.

FIG. 8 illustrates an embodiment (200) starting from the STI etch back process. The etching can be achieved by a dry etch process with chemistry etching away either the silicon oxide or silicon nitride or the combination thereof (i.e., a hybrid STI scheme). The target etch depth can be 30 nm, such that the same number of fins (204) is exposed above the remaining STI (208).

Figure 9:
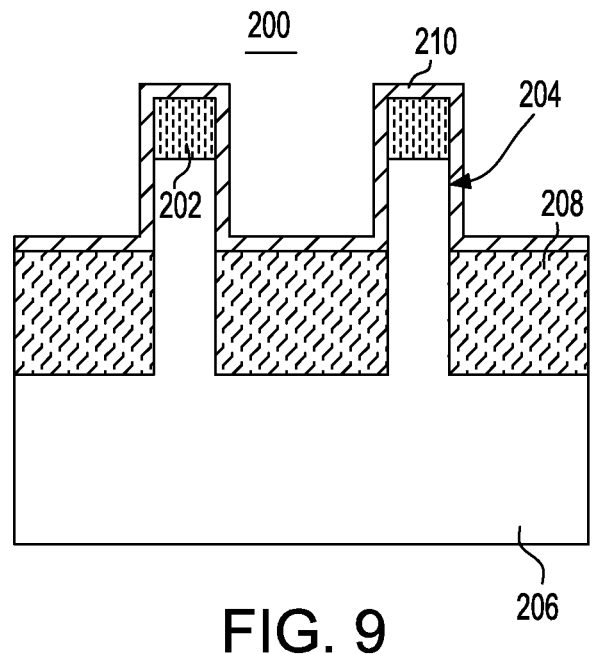
FIG. 9 shows another cross-sectional view of a semiconductor device having a substrate and fin structures formed and covered with high-k dielectric.

FIG. 9 illustrates the high-k material deposition (210). The material serves as the gate dielectric to provide a higher-K value for better device drive current benefit but without increasing the physical thickness that may cause additional leakage current. The typical high-k material used can include HfO2, Al2O3, and La2O3. The process proceeds preferably with a post-deposition anneal at 700° C. in the furnace to densify the film after deposition. Usually, because of the oxygen effect, there is a 1 nm interfacial SiOx layer formed between the high-k material and the silicon substrate. Deposition is achieved by the atomic layer deposition (ALD) to achieve thickness control and good conformality from the top of the fin to the bottom.

Figure 10:
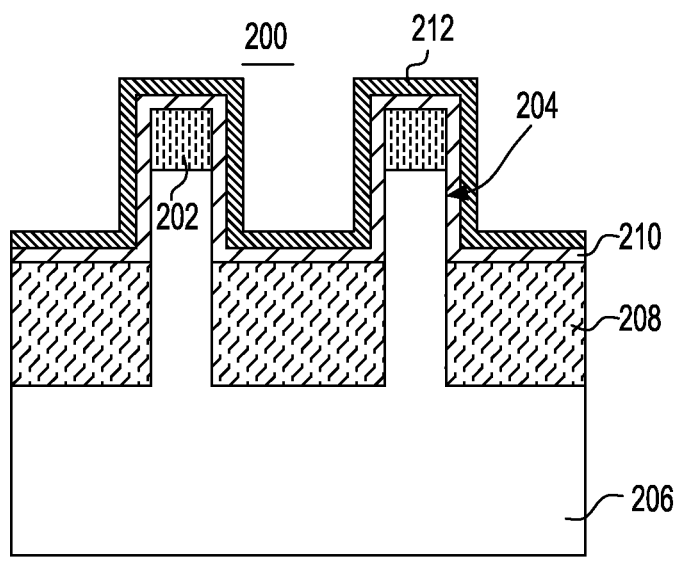
FIG. 10 is a cross-sectional view of a semiconductor device having a substrate and fin structures formed and covered with high-k dielectric and n-type MOSFET workfunction.

FIG. 10 illustrates the deposition of workfunction metal (212). A typical workfunction metal includes TiN, TaN, TiAlN, and TiC. The deposition is achieved by an atomic layer deposition (ALD) to achieve thickness control and good conformality from the top of the fin to its bottom. The purpose of the workfunction metal is to provide a right threshold voltage of the transistor to ensure that the device can produce enough drive current for switching the circuit.

Figure 11:
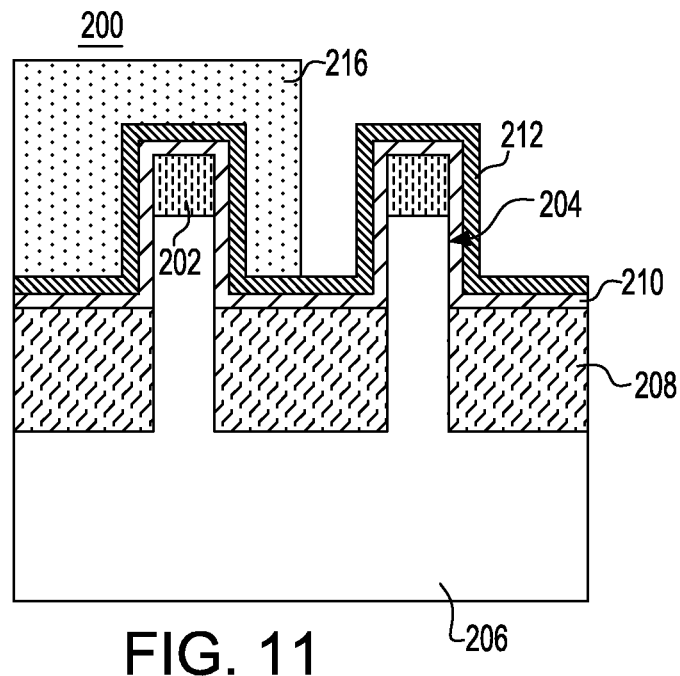
FIG. 11 depicts a cross-sectional view of a semiconductor device having a substrate and fin structures formed and covered with high-k dielectric and an n-type MOSFET workfunction, with an n-type MOSFET region being covered by soft or hardmask for pattering, according to an embodiment of the invention.

FIG. 11 is an illustration of the gate stack patterning process. The structure is first covered with either a soft or a hard mask (216). It then proceeds going through a photo-lithography process to initiate the patterning so that the n-FET region is covered while the p-FET region opens up.

Figure 12:
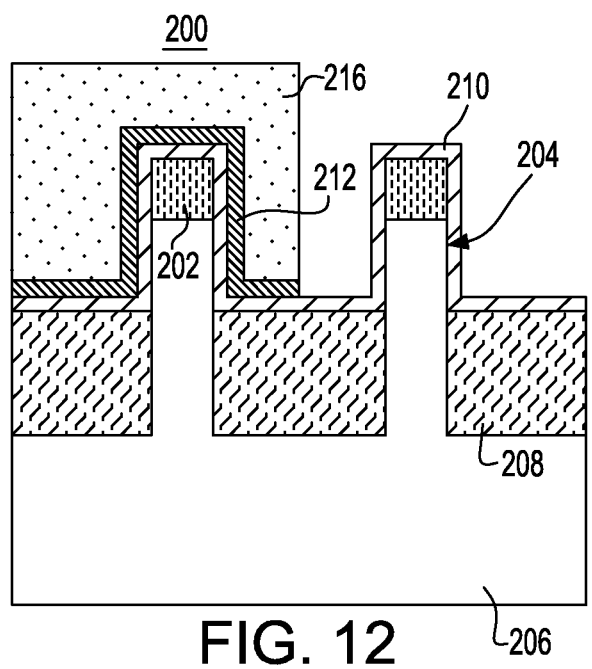
FIG. 12 shows a cross-sectional view of a semiconductor device having a substrate and fin structures formed and covered with high-k dielectric with n-type MOSFET workfunction etched away in the p-type MOSFET region according to another embodiment of the invention.

FIG. 12 is an illustration of the etch of n-type MOSFET workfunction metal (212) from the p-type MOSFET region. Most of the workfunction metal shows a certain level of strain but only favorable for one type of transistor carrier transport. By way of example, a TaN film has a tensile strain up to 2 GPa which is beneficial to the electron transport but is detrimental to the hole transport. Furthermore, experimentally, from several dark field holography strain measurement results, one can observe the TiN, either by ALD (25A) or PVD (140A) that induces a significant strain in the silicon channel. The 'Fin-only' structure shows no strain. An amorphous silicon deposition added to annealing induces a strain in the opposite direction to TiN. The amorphous silicon layer itself induces no strain. Based on the aforementioned results, the most significant contributors are the TiN deposition and the annealing of the amorphous silicon. The purpose of removing the n-type workfunction metal not only provides the right threshold voltage in the p-type MOSFET region, but it also reduces the impact of an unfavorable strain in the p-type MOSFET region. Another added benefit is to free the space between the fins as only a single layer workfunction metal instead of two to be deposited. This leads to a potentially large volume of the ensuing W gate contact to further enhance the strain effect using W as a film known for strain generation.

Figure 13:
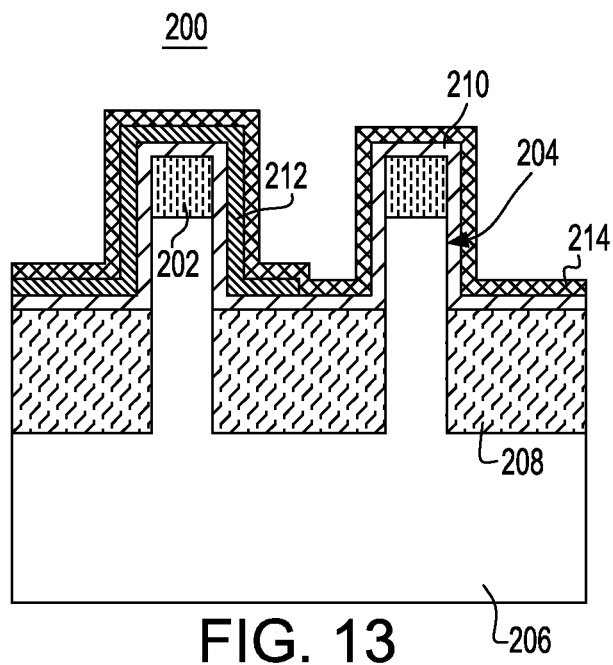
FIG. 13 is a cross-sectional view of a semiconductor device having a substrate and fin structures formed thereon and covered with a high-k dielectric, an n-type MOSFET workfunction and p-type MOSFET according to a further embodiment of the invention.

FIG. 13 is an illustration of the deposition of p-type MOSFET workfunction metal (214) in the p-type MOSFET region. As previously mentioned, the patterning process enables individual tuning of a strain level and a type of strain in both n-type and p-type MOSFET.

Figure 14:
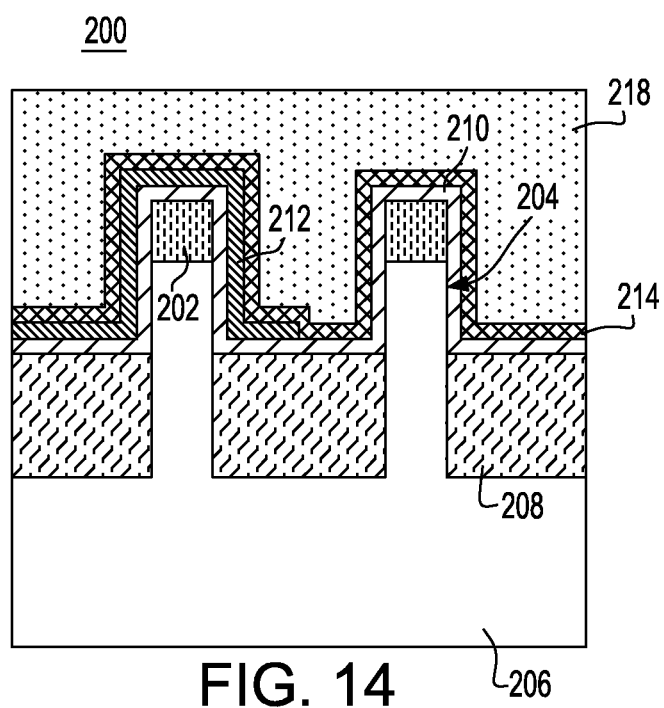
FIG. 14 illustrates a cross-sectional view of a semiconductor device having a substrate and fin structures formed thereon covered with high-k dielectric, n-type MOSFET workfunction, p-type MOSFET and a high Ge percentage silicon germanium film or a highly stress Tungsten film, according to still another embodiment of the invention.

FIG. 14 is an illustration of the deposition of W gate contact (218) in both, the n-type and the p-type MOSFET regions. As previously mentioned, W is a film known for generating a strain, but the presence of multiple layers, e.g., such as a high-k dielectric, interfacial layer, and workfunction metal layer(s) underneath sandwiched between the W film and the silicon channel leads to a poor stress coupling from the W gate contact to the channel. Having the aforementioned patterning process frees the space in the p-type MOSFET region, which can create a large volume of W deposited and which potentially can lead to a better stress coupling, is believed to improve the strain effect from the gate. Experimentally, it has been observed that with the new scheme, the hole mobility and the short channel resistance reduction leads to an overall mobility enhancement because of the Tungsten applying a compressive strain and the workfunction displaying a tensile strain. By removing the first layer of workfunction metal in the p-type MOSFET region, the compressive strain can be applied to the channel in both the in-plane (220) and the off-plane (002) direction that is favorable for a hole transport. There is also a highly stress W film available if a further boost is required for an improved performance. The stress level measured in the blanket films can be enhanced from 2.3 GPa to 3.5 GPa, while in a contact array, the improvement ranges from 1.6 GPa to 2.2 GPa.

Figure 15:
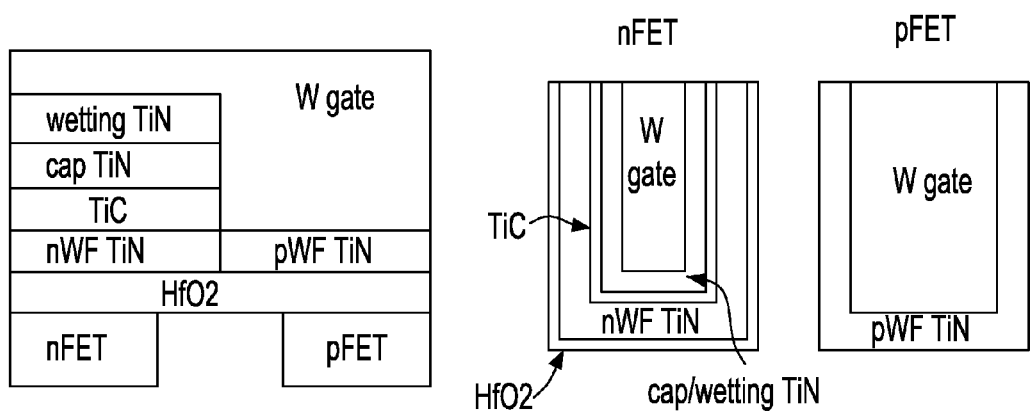
FIG. 15 depicts a cross-sectional view of multiple layers of gate stack in both, an n-type and a p-type MOSFET region to explain the structure provided with a potential mobility boost from the gate stack.

FIG. 15 shows a cross-sectional view of multiple layers of the gate stack in both the n-type and p-type MOSFET regions. The n-FET first patterning freezes up the space for the W fill to induce the channel strain from the gate, where the p-type FET consists of only a very thin TiN metal that leaves sufficient room for the W fill along the PC and the fin direction. Experimental data suggests the proposed device structure improves long-channel and short-channel mobility significantly in an advanced CMOS technology. The high stress W film can also be incorporated to further boost the performance.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming a semiconductor device structure comprising:
   forming fins on a substrate;
   forming a gate stack over said fins, leaving a source region and a drain region exposed;
   forming a thin layer of polycrystalline silicon over said fins;
   epitaxially growing a high GE percentage silicon germnium film on top of said polycrystalline silicon; and forming a transistor channel by wrapping said gate stack around said fins.

2. The method as recited in claim 1, further comprising:
patterning a workfunction metal forming sequentially an n-type and p-type transistor, and
depositing a stress Tungsten (W) film in a space freed by patterning between said fins.

3. The method as recited in claim 1, further comprising depositing a high-k dielectric material in said gate stack.

4. The method of claim 3, wherein said high-k dielectric material is made of $HfO_2$, $Al_2O_3$, or $La_2O_3$, and said deposition is followed by performing a post deposition anneal.

5. The method of claim 1 wherein said workfunction metal provides a threshold voltage of said transistor producing a drive current for switching a circuit.

6. The method of claim 1 further comprising:
depositing a thin layer of polycrystalline silicon;
depositing a stress film made of high Ge percentage silicon germanium film or a highly stress Tungsten film on top of said polycrystalline silicon layer;
freeing a space between said fins to position said stress films deposited closer to said transistor channel to improve a proximity of said stress containing material to said transistor channel; and
enhancing a stress coupling efficiency by way of a ratio between a stress level in said stress film, and said stress transferred to said transistor channel for mobility enhancement.

7. The method of claim 6 wherein said stress is enhanced by patterning to remove an n-type workfunction metal from a p-type transistor.

8. The method of claim 7, further comprising stripping off a soft or a hard mask of said deposited p-type workfunction metal.

9. The method of claim 7 wherein freeing said space for said p-type transistor between said fins achieves a higher stressor and better coupling from said stressor to said channel.

10. The method of claim 1, wherein growing said high Ge percentage silicon germanium film on top of said polycrystalline silicon is doped in-situ or ex-situ, said dopant lowering a gate resistance.

11. The method of claim 10, wherein said in-situ doped film is achieved by incorporating said dopants during said silicon germanium epitaxial growth, and wherein said ex-situ doped film is achieved by an ion-implantation followed by said epitaxial growing of said silicon germanium film.

12. The method of claim 1, wherein a stress coupling efficiency is determined by a ratio between a stress level in said stressor film and a stress transferred to said channel for mobility enhancement.

13. The method of claim 8 further comprising stripping a mask of said p-type workfunction metal deposited in both n-type and p-type MOSFET regions, and wherein freeing said space for said p-type transistor between said fins provides a higher stressor coupling, and boosts a carrier mobility.

14. A FinFET device structure comprising:
a substrate provided with fins;
a gate stack on top of said fins and an exposed source region and an exposed drain region;
a thin layer of polycrystalline silicon on top of said fins;
a high Ge percentage silicon germanium film on top of said polycrystalline silicon; and
a transistor channel with said gate stack wrapped around said fins.

15. The FinFet device structure of claim 13 further comprising: a high-k dielectric material on a patterned fin structure with a recess shallow trench isolation (STI); and
a workfunction metal and a thin layer of a high percentage Ge polycrystalline silicon on top of said high-k dielectric material.

16. The FinFet device structure of claim 13, wherein a space between said fins and stressor films are in a proximity to said channel.

17. The FinFet device structure of claim 14 further comprising a stripped mask of said p-type workfunction metal in both n-type and p-type transistor regions, wherein a freed space for said p-type transistor between said fins provides a higher stressor coupling, for boosting carrier mobility.

* * * * *